(12) United States Patent
Wu

(10) Patent No.: US 6,482,739 B2
(45) Date of Patent: Nov. 19, 2002

(54) METHOD FOR DECREASING THE RESISTIVITY OF THE GATE AND THE LEAKY JUNCTION OF THE SOURCE/DRAIN

(75) Inventor: Bing-Chang Wu, Shu-Lin Chen (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/790,163

(22) Filed: Feb. 21, 2001

(65) Prior Publication Data

US 2002/0115288 A1 Aug. 22, 2002

(51) Int. Cl.7 .......................................... H01L 21/4763
(52) U.S. Cl. ..................... 438/664; 438/682; 438/663; 438/685; 438/655; 438/653; 438/656
(58) Field of Search ............................... 438/664, 682, 438/683, 685, 655, 653, 656, 663

(56) References Cited

U.S. PATENT DOCUMENTS 6,136,705 A * 10/2000 Blair ......................... 438/682
6,187,675 B1 * 2/2001 Buynoski ................... 438/655

* cited by examiner

Primary Examiner—Long Pham
(74) Attorney, Agent, or Firm—Powell Goldstein Frazer & Murphy LLP

(57) ABSTRACT

This invention relates to a method for decreasing the resistivity of the gate and leaky junction of the source/drain, more particularly, to the method for forming a metal silicide layer at the gate region and the source/drain region by using two times in depositing metal layer. This condition will form a thicker metal silicide layer at the gate region to decrease the resistivity of the gate and will form a thinner metal silicide layer at the source/drain region to decrease defects in leaky junction at the source/drain region. At first, a semiconductor substrate is provided and a MOS is formed on the substrate and a shallow trench isolation is formed in the substrate. The MOS comprises a gate region, a source region, a drain region, and a spacer which is formed on the sidewall of the gate. The first metal layer is formed over the MOS and a oxide layer is formed over the first metal layer. Partial oxide layer is etched to show the first metal layer which is formed on the gate. The first metal layer which is on the gate is removed. The remained oxide is removed. The second metal layer is formed on the first metal layer. Then two times rapid thermal process are passed through and the salicide process is finished.

26 Claims, 5 Drawing Sheets

METHOD FOR DECREASING THE RESISTIVITY OF THE GATE AND THE LEAKY JUNCTION OF THE SOURCE/DRAIN

BACKGROUND OF THE INVENTION

1. Field of the Invention

This invention relates to a method for decreasing the resistivity of the gate and leaky junction of the source/drain, more particularly, to the method for forming a metal silicide layer at the gate region and the source/drain region by using two times in depositing metal layer. This condition will form a thicker metal silicide layer at the gate region to decrease the resistivity of the gate and will form a thinner metal silicide layer at the source/drain region to decrease defects in leaky junction at the source/drain region.

2. Description of the Prior Art

An increment in device integrity makes the resistance of metal oxide semiconductor (MOS) device source/drain regions gradually climb up and almost equal to the resistance of MOS device channel. In order to reduce the sheet resistance of source/drain regions and to guarantee a complete shallow junction between metal and MOS device, the application of a "Self aligned Silicide" process is gradually steeping into the very large scale integration (VLSI) fabrication of 0.5 micron ($\mu$m) and below. This particular process is called "Salicide" for short.

In general, the titanium silicon is usually used in silicide. The titanium silicide is formed to use two sequence steps rapid thermal process. At first, referring to FIG. 1, a silicon substrate 10 is provided and a MOS device and a shallow trench isolation are formed thereon. The MOS device comprises a source/drain region 12 a gate region, and as well as a spacer 18 formed on the sidewalls of the gate region. This gate region comprises a gate oxide layer 14 and a polysilicon layer 16, then using the chemical vapor deposition technique or the magnetron direct current sputtering technique to deposit a titanium the metal layer 20 over the MOS and the shallow trench isolation. The thickness of the titanium metal layer 20 is about more than 300 angstroms. Next, a rapid thermal process is performed, wherein part of the titanium metal layer will react with the silicon on the source/drain region and with the polysilicon of the gate region to form a titanium silicide layer. The thickness of this titanium silicide layer is about 600 to 700 angstroms. The structure of this titanium silicide layer is a metastable C-49 phase structure with higher resistivity. Referring to FIG. 2, the unreacted titanium metal and the remained titanium metal are removed by applying the RCA cleaning method. Therefore, the titanium silicide layer 22 is existed on top of the gate region and the source/drain region. Finally, a rapid thermal process is performed again to transformer higher resistivity of the C-49 phase titanium silicide structure into lower resistivity of the C-54 phase titanium silicide structure.

In the deep sub-micron device fabrication, the decline of the device driving current that cause by parasitic seties resistance of source/drain can be avoided by siliciding the source/drain. The above can be accomplished by either using simple silicidation of source/drain of self-aligned silicidation, where self-aligned silicidation can accomplish the silicidations of source/drain and gate region at the same time.

However, in accompanying with the shrinkage of the devices, the conventional method of depositing titanium metal to a thickness greater than about 300 angstroms, and as well as using rapid thermal process for forming titanium silicide, thicker silicon substrate is consumed at the source/drain region. Therefore, results in shallower junctions. In order to avoid the formation of leaky junctions, the thickness of the silicide layer at the source/drain region must be thinner enough as devices to be shrinked in size. If the thinner titanium metal layer is formed over the MOS and is passed through two times of the rapid thermal process, the produced titanium silicide layer is thinner at the source/drain region. But titanium silicide layer is following thinner at the gate region to cause higher resistivity of the gate. Therefore, the thicker titanium silicide layer is formed at the gate region and the thinner titanium silicide layer is formed at the source/drain region by using the present invention method.

SUMMARY OF THE INVENTION

In accordance with the above-mentioned invention backgrounds, the traditional method can not form a thicker metal silicide layer at the gate region and a thinner metal silicide layer at the source/drain region. The present invention provides a method to use two steps in forming metal layer to form a thicker metal silicide layer at the gate region and to form a thinner metal silicide layer at the source/drain region to decrease the volume of the semiconductor element successfully.

The second objective of this invention is to increase the integrity of the elements in the semiconductor by using two steps in forming metal layer to form a thicker metal silicide layer at the gate region and to form a thinner metal silicide layer at the source/drain region.

The third objective of this invention is to decrease the resistance value of the gate and decrease the defects in the leaky junctions of the source/drain region by using two steps in forming metal layer to form a thicker metal silicide layer at the gate region and to form a thinner metal silicide layer at the source/drain region.

It is a further objective of this invention to increase the qualities of the semiconductor elements by using two steps in forming metal layer to form a thicker metal silicide layer at the gate region and to form a thinner metal silicide layer at the source/drain region.

In according to the foregoing objective, the present invention provides a metal o use two steps in forming metal layer to form a thicker metal silicide layer at the gate region and to form a thinner metal silicide layer at the source/drain region to decrease the volume of the semiconductor element successfully and to increase the integrity of the elements in the semiconductor. When the volume of the semiconductor elements is decreased, the metal silicide at the gate region is thicker to cause the lower resistivity and the metal silicide at the source/drain region is thinner to cause the defects in the leaky junction hardly. Therefore, the qualities of the semiconductor elements can be increased by using the present invention method.

BRIEF DESCRIPTION OF THE DRAWINGS

In the accompanying drawing forming a material part of this description, there is shown.

DESCRIPTION OF THE PREFERRED EMBODIMENT

The foregoing aspects and may of the attendant advantages of this invention will become more readily appreciated as the same becomes better understood by reference to the following detailed description, when taken in conjunction with the accompanying drawings, wherein:

In the traditional salicide process, only a metal layer is formed on the MOS and the metal silicide layers are formed at the gate region and the source/drain region at the same time. Therefore, the thickness of the metal silicide layer which is formed at the gate region and the thickness of the metal silicide layer which is formed at the source/drain region are the same. When the volume of the semiconductor element is smaller and smaller or the width of the process is less than 0.1 microns, the traditional salicide process can not decrease the resistivity of the gate and decrease the defects in leaky junction at the source/drain region at the same time. The present invention is must used to shrink the volume of the semiconductor element successfully and to increase the qualities of the semiconductor element.

Figure 1:
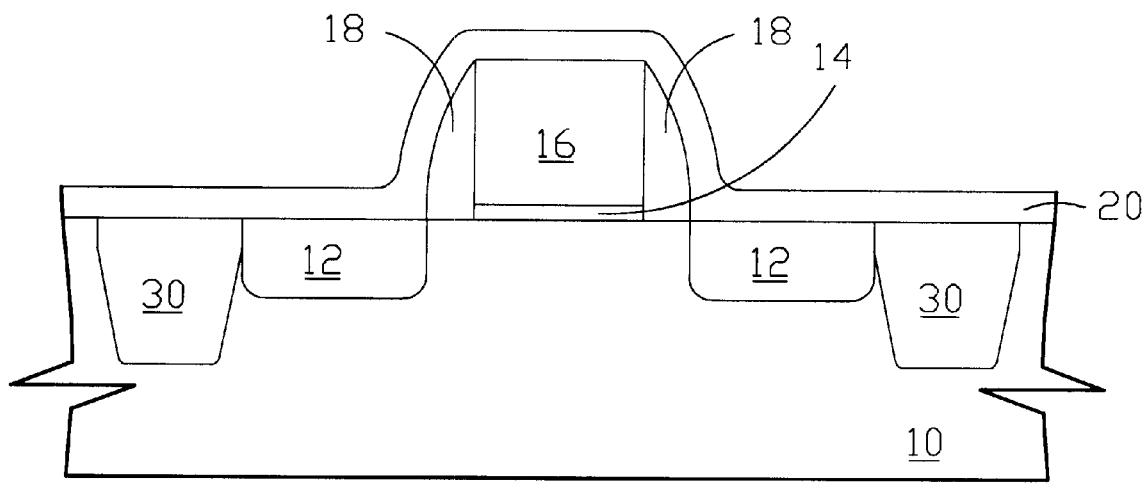
FIG. 1 shows a diagram in forming a titanium layer over the MOS by using the traditional technology.
Figure 2:
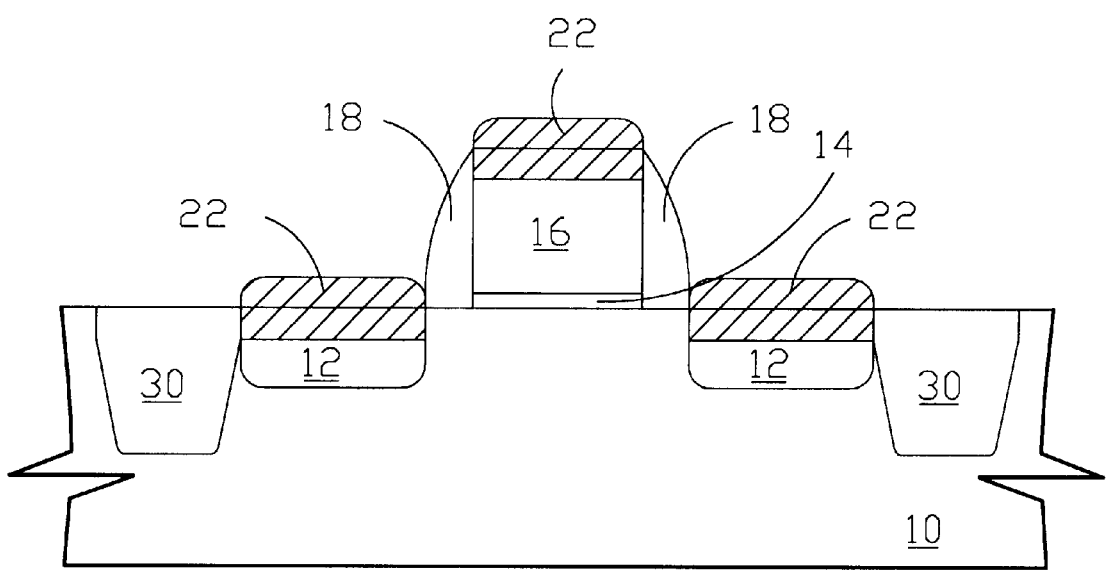
FIG. 2 shows a diagram in forming a titanium silicide layers on the gate region and source/drain region by using the traditional technology.
Figure 3:
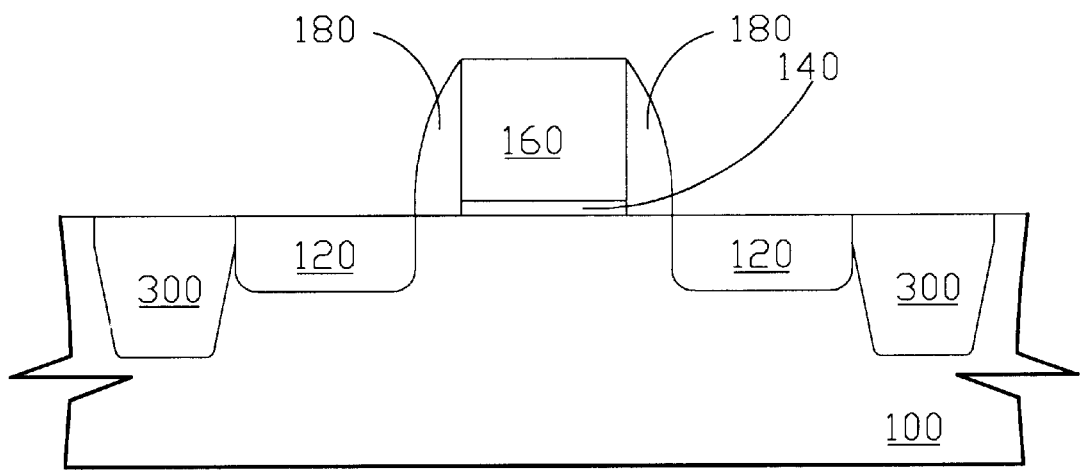
FIG. 3 shows a diagram is forming a MOS and a shallow trench isolation layer on the substrate of the wafer.

Referring to FIG. 3, a wafer wherein a substrate 100 is formed is provided. The substrate can be a silicon substrate. A MOS and a shallow trench isolation layer 300 have been formed on the substrate 100. The MOS comprises the source/drain 120, the gate, and the spaces 180 which is formed on the sidewalls of the gate. The gate comprises a gate oxide layer 140 and a polysilicon layer 160. At first, the oxide which is on the substrate is cleaned.

Figure 4:
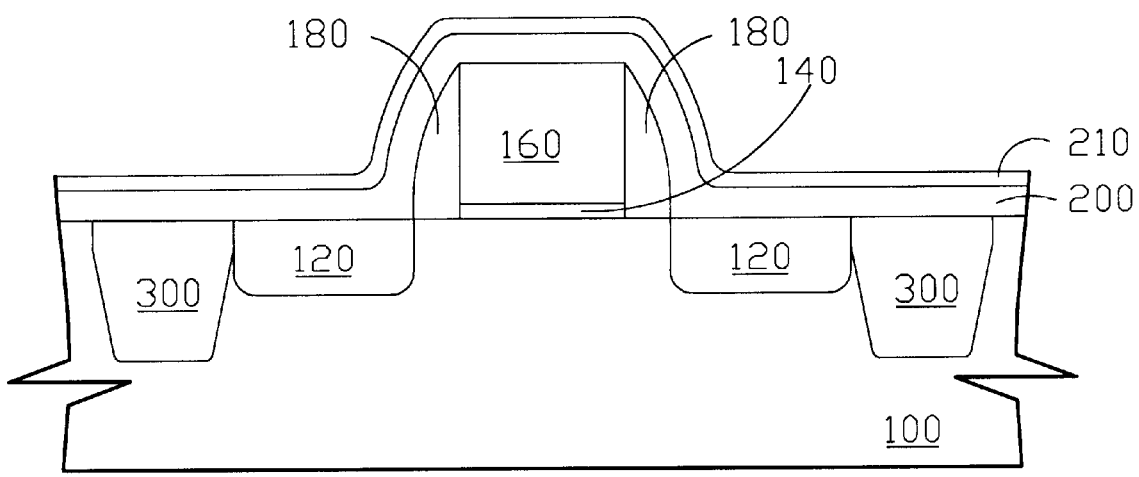
FIG. 4 shows a diagram in forming the first metal layer on the barrier substrate.

Referring to FIG. 4, the first metal layer 200 is formed on the substrate 100 and a barrier layer 210 is formed on the surface of the first metal layer 200. The first metal layer 200 covers with the MOS region and the shallow trench isolation layer 300. The material of the first metal layer 200 can be titanium, cobalt, and platinum. The titanium is usually used to be the material of the first metal layer 200. The first metal layer 200 is usually formed by using the chemical vapor deposition (CVD) method and the direct current magnetron sputtering method. The thickness of the first metal layer 200 is about 50 to 200 angstroms. The metal nitride is usually used to be the material of the barrier layer 210. After the first metal layer 200 is formed, nitrogen is transported to make the surface of the first metal layer 200 transformed into the metal nitride layer to be the barrier layer 210.

Titanium is the most common used metallic material for the current salicide process (others include platinum, cobalt, etc.). Basically, titanium is a fine oxygen gettering material, where under an appropriate temperature titanium and a silicon at MOS device source/drain and gate regions are easily mutually diffused to form a titanium silicide with very low resistance.

Figure 5:
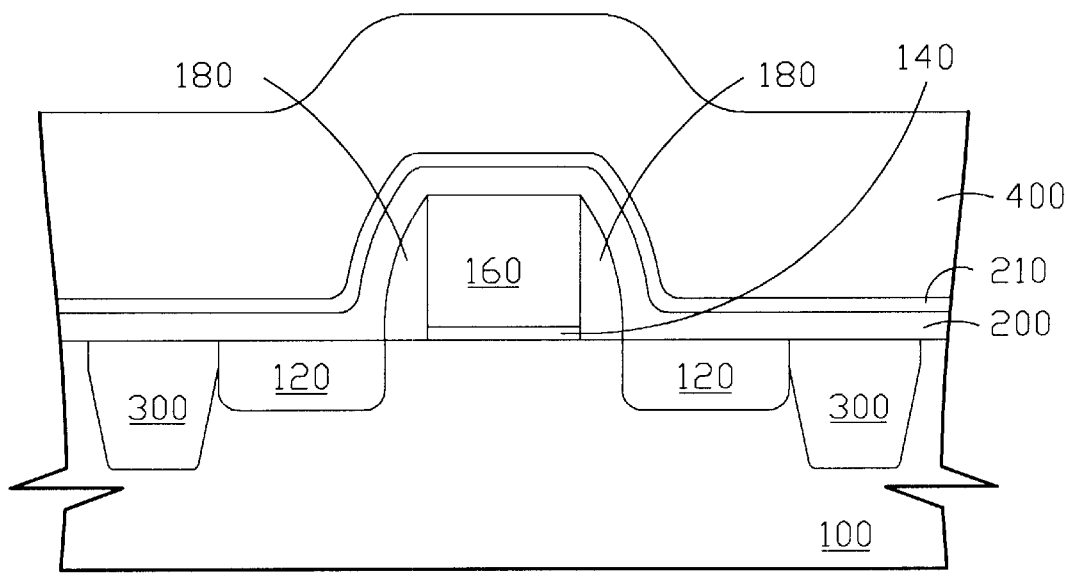
FIG. 5 shows a diagram in forming the oxide layer on the barrier layer.
Figure 6:
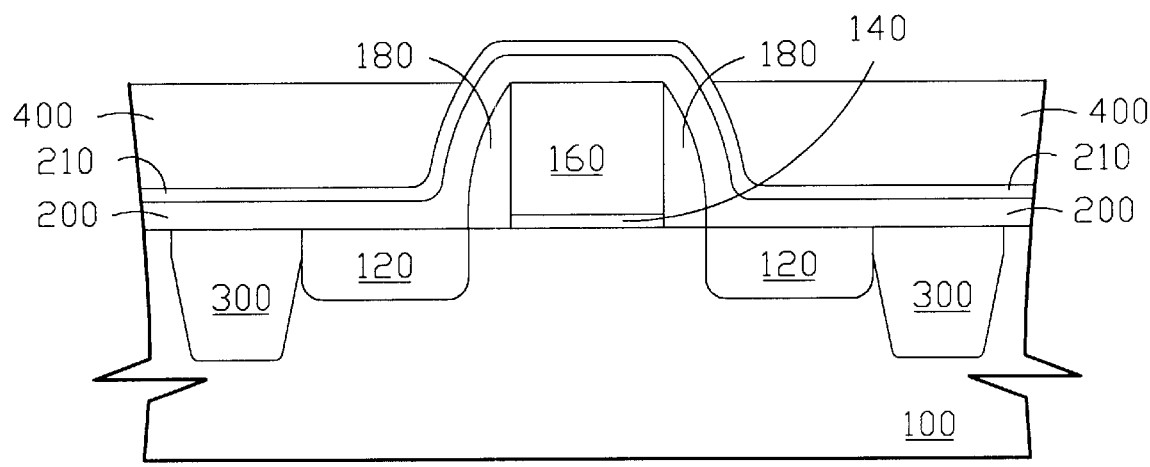
FIG. 6 shows a diagram in removing the partial oxide layer to show the barrier layer which is on the top of the gate.
Figure 7:
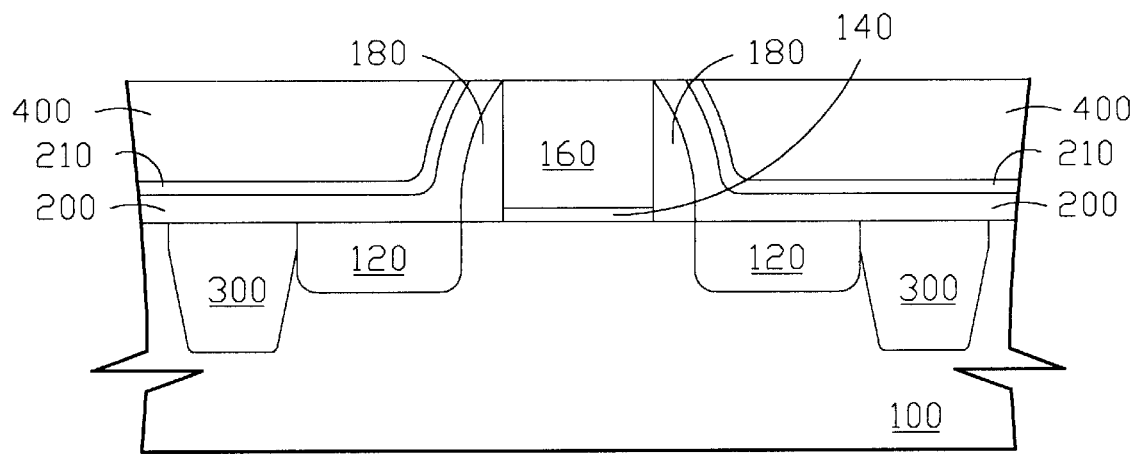
FIG. 7 shows a diagram in removing the barrier layer and the first metal layer which is on the gate.
Figure 8:
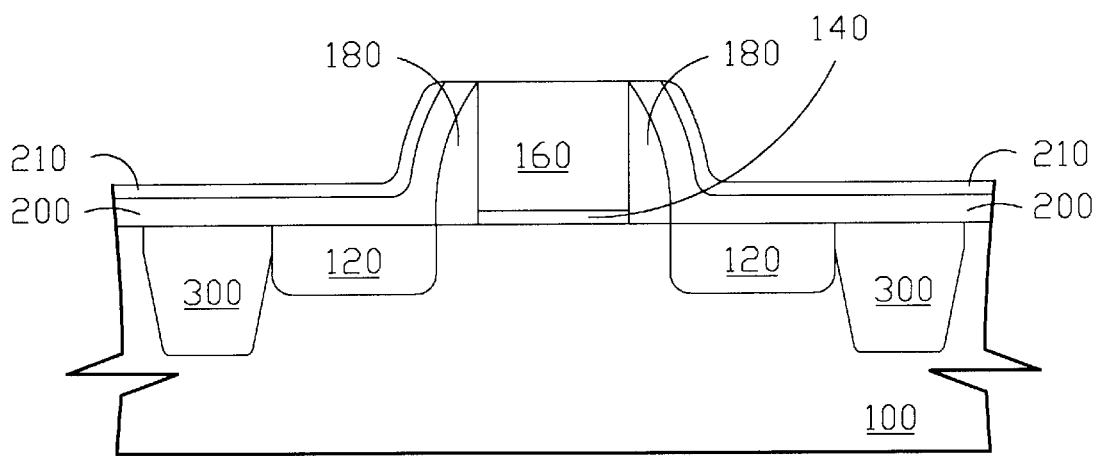
FIG. 8 shows a diagram in removing the remained oxide ayer.
Figure 9:
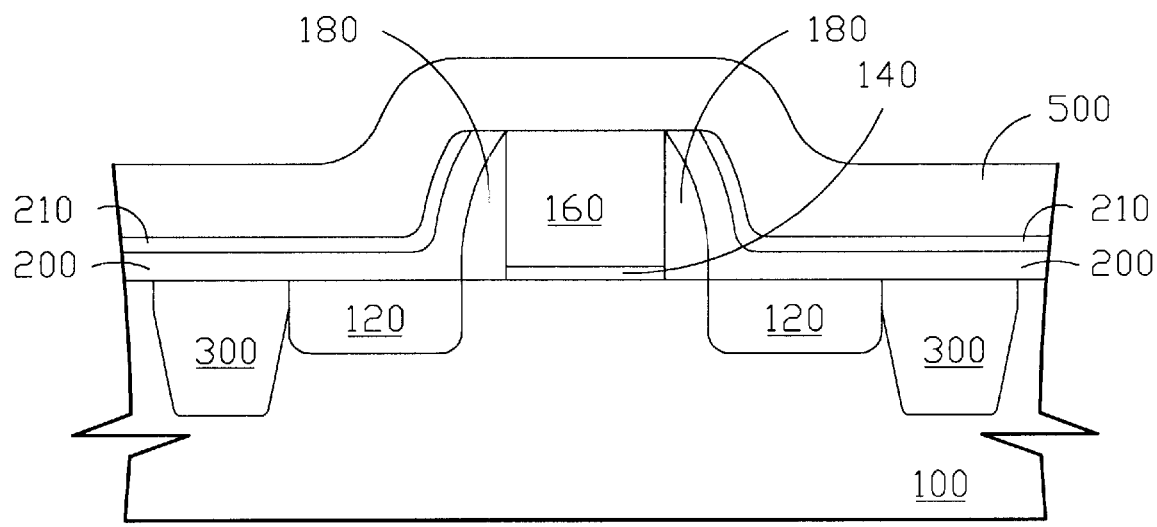
FIG. 9 shows a diagram in forming the second metal layer on the barrier layer and the polysilicon layer.

Referring to FIG. 5, a thicker oxide layer 400 is formed on the barrier layer 210 and the material of the thicker oxide layer 400 can be tetraethylorthosilicate. Referring to FIG. 6, the partial oxide layer 400 is etched to show the barrier layer 210 which is on the top of the gate. Referring to FIG. 7, the barrier layer 210 and the first metal layer 200 which are on the top of the gate are removed to show the polysilicon layer 160. Referring to FIG. 8, the remained oxide layer 400 is removed. Referring to FIG. 9, the second metal layer 500 is formed on the barrier layer 210 and the polysilicon layer 160. The thickness of the second metal layer 500 is about more than 300 angstroms and the material of the second metal layer can be titanium, cobalt, and platinum. The titanium is usually used to be the material of the second metal layer 500. The second metal layer 200 is usually formed by using the chemical vapor deposition method and the direct current magnetron sputtering method.

Figure 10:
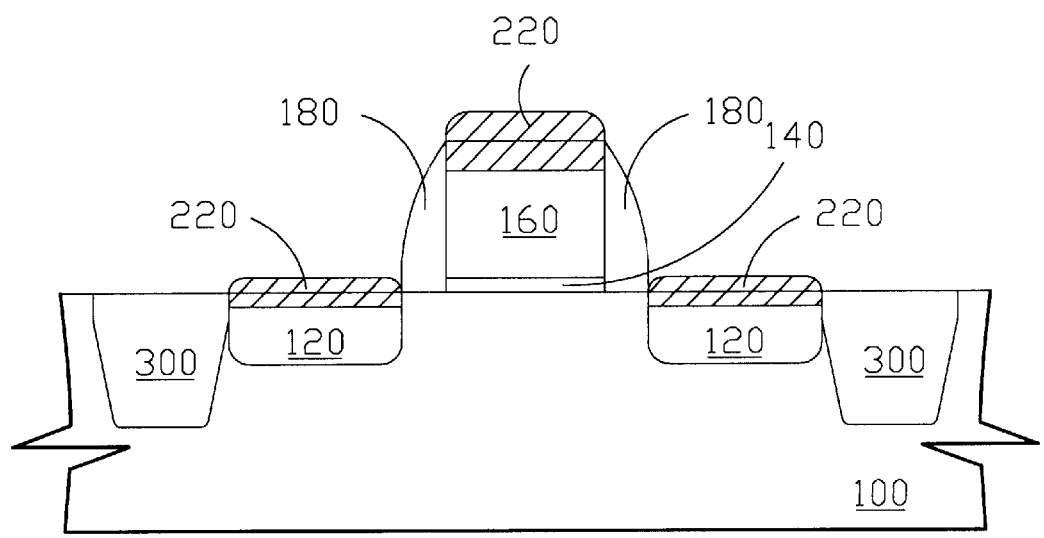
FIG. 10 shows a diagram in forming a titanium silicide layers on the gate region and source/drain region by using the traditional technology.

Then the wafer is placed in to the chamber to proceed the first rapid thermal process (RTP). The metal layer will react with the silicon layer which is at the contact region to form the metal silicide layer. The using temperature of the forming metal silicide layer process is about 500 to 700° C. The structure of the metal silicide which is formed in the first rapid thermal process is a metastable C-49 phase structure with higher resistivity. Referring to FIG. 10, the unreacted and the remained first metal layer 200, barrier layer 210, and second metal layer 500 are removed by applying the RCA cleaning method. Therefore, the metal silicide layers 200 are existed on the top of the gate region and the source/drain region. Finally, the second rapid thermal process is performed to transform higher resistivity of the C-49 phase metal silicide structure into lower resistivity of the C-54 phase metal silicide structure. The using temperature of the second rapid thermal process is about 750 to 850° C. At this time, the thickness of the metal silicide layer 220 which is at the gate region is thinner and the thickness of the metal silicide layer 220 which is at the source/drain region is thicker.

The first metal layer is principle used to form the metal silicide layer at the source/drain region. In order to form a thinner metal silicide layer at the source/drain region, the thickness of the metal silicide layer is thinner to decrease the defects in leaky junction at the source/drain region. The thickness of the first metal layer is about 50 to 200 angstroms.

The second metal layer is principle used to form the metal silicide layer at the gate region. In order to form a thicker metal silicide layer at the gate region, the thickness of the metal silicide layer is thicker to decrease the resistivity of the gate. The thickness of the second metal layer is about more than 300 angstroms.

After forming the first metal layer, a barrier layer must be formed on the surface of the first metal layer. The function of the barrier layer is to prevent the metal ions which are in the second metal layer permeating into the first metal layer to increase the thickness of the first metal layer and to increase the thickness of the metal silicide layer which is at the source/drain region to cause the defects in leaky junction at the source/drain region. Usually after forming the first metal layer, nitrogen will be transported into the chamber to form the metal nitride layer on the surface of the first metal layer to be the barrier layer to keep the thickness of the first layer.

In accordance with the present invention, the present invention provides a method for forming a metal silicide layer at the source/drain region by using the first metal layer and forming a metal silicide layer at the gate region by using the second metal layer. The metal silicide layer which is at the source/drain region and the metal silicide layer which is at the gate region are respectively produced to make the thinner metal silicide layer which is at the source/drain region and to make the thicker metal silicide layer which is at the gate region. This condition can decrease the resistivity of the gate and decrease the defects in leaky junction at the source/drain region. This condition can also shrink the volume of the semiconductor element successfully and increase the integrity of the elements in the semiconductor. This condition can further keep the electricity of the semiconductor element and increase the qualities of the semiconductor elements.

Although specific embodiments have been illustrated and described, it will be obvious to those skilled in the art that various modifications may be made without departing from what is intended to be limited solely by the appended claims.

What is claimed is:

1. A method for forming a salicide, said method comprises:
    providing a wafer, said wafer comprises a substrate, said substrate comprises a metal oxide semiconductor, said metal oxide semiconductor comprises a gate region, a source region, and a drain region;
    forming a first metal layer on said substrate;
    forming a oxide layer on said first metal layer;
    removing a part of said oxide layer to show said first metal layer;
    removing a part of said first metal layer to show said gate region;
    removing said oxide layer;
    forming a second metal layer on said first metal layer and said gate region;
    proceeding a first rapid thermal process to form a metal silicide layer at said gate region, said source region, and said drain region;
    removing said first metal layer and said second metal layer; and
    proceeding a second rapid thermal process.

2. The method according to claim 1, wherein a material of said first metal layer is titanium.

3. The method according to claim 1, wherein a material of said first metal layer is cobalt.

4. The method according to claim 1, wherein a material of said first metal layer is platinum.

5. The method according to claim 1, wherein a material of said first metal layer is titanium.

6. The method according to claim 1, wherein a material of said second metal layer is cobalt.

7. The method according to claim 1, wherein a material of said second metal layer is platinum.

8. The method according to claim 1, wherein said oxide layer is a tetraethylorthosilicate.

9. The method according to claim 1, wherein said metal oxide semiconductor comprises a spacer.

10. The method according to claim 1, wherein a barrier layer is at the plate between said first metal layer and said second metal layer.

11. A method for forming a salicide, said method comprises:
    providing a wafer, said wafer comprises a substrate, said substrate comprises a metal oxide semiconductor, said metal oxide semiconductor comprises a gate region, a source region, and a drain region;
    forming a first metal layer on said substrate;
    forming a barrier layer on a surface of said first metal layer;
    forming a oxide layer on said barrier layer;
    removing a part of said oxide layer to show said barrier layer which is at said gate region;
    removing said barrier layer and said first metal layer which are at said gate region to show said gate region;
    removing said oxide layer;
    forming a second metal layer on said barrier layer and said gate region;
    proceeding a first rapid thermal process to form a metal silicide layer at said gate region, said source region, and said drain region;
    removing said first metal layer, said barrier layer and said second metal layer; and
    proceeding a second rapid thermal process.

12. The method according to claim 11, wherein a metal of said first metal layer is titanium.

13. The method according to claim 11, wherein a material of said first metal layer is cobalt.

14. The method according to claim 11, wherein a material of said first metal layer is platinum.

15. The method according to claim 11, wherein a material of said second metal layer is titanium.

16. The method according to claim 11, wherein a material of said second metal layer is cobalt.

17. The method according to claim 11, wherein a material of said second metal layer is platinum.

18. The method according to claim 11, wherein said oxide layer is a tetraethylorthosilicate.

19. The method according to claim 11, wherein a material of said barrier layer can be a metal nitride.

20. A method for forming a salicide, said method comprises:
    providing a wafer, said wafer comprises a substrate, said substrate comprises a metal oxide semiconductor, said metal oxide semiconductor comprises a gate region, a source region, and a drain region;
    forming a first metal layer on said substrate;
    forming a metal nitride layer on a surface of said first metal layer;
    forming a tetraethylorthosilicate layer on said metal nitride layer;
    removing a part of said tetraethylorthosilicate layer to show said metal nitride layer which is at said gate region;
    removing said metal nitride layer and said first metal layer which are at said gate region to show said gate region;
    removing said tetraethylorthosilicate layer;
    forming a second metal layer on said metal nitride layer and said gate region;
    proceeding a first rapid thermal process to form a metal silicide layer at said gate region, said source region, and said drain region;
    removing said first metal layer, said metal nitride layer and said second metal layer; and
    proceeding a second rapid thermal process.

21. The method according to claim 20, wherein a material of said first metal layer is titanium.

22. The method according to claim 20, wherein a material of said first metal layer is cobalt.

23. The method according to claim 20, wherein a material of said first metal layer is platinum.

24. The method according to claim 20, wherein a material of said second metal layer is titanium.

25. The method according to claim 20, wherein a material of said second metal layer is cobalt.

26. The method according to claim 20, wherein a material of said second metal layer is platinum.

* * * * *